United States Patent
Shimotsu

(10) Patent No.: US 7,864,820 B2
(45) Date of Patent: Jan. 4, 2011

(54) LASER LIGHT SOURCE DEVICE

(75) Inventor: Shinichi Shimotsu, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/410,733

(22) Filed: Mar. 25, 2009

(65) Prior Publication Data

US 2009/0245303 A1 Oct. 1, 2009

(30) Foreign Application Priority Data

Mar. 26, 2008 (JP) .............................. 2008-080758

(51) Int. Cl.
*H01S 3/30* (2006.01)
(52) U.S. Cl. ................. 372/6; 372/26; 372/27; 372/50.12
(58) Field of Classification Search ...................... 372/6, 372/26, 27
See application file for complete search history.

(56) References Cited

U.S. PATENT DOCUMENTS 7,113,657 B2 9/2006 Park

2007/0147750 A1* 6/2007 Teramura et al. ............. 385/115
2009/0067843 A1* 3/2009 Way et al. ...................... 398/79

FOREIGN PATENT DOCUMENTS

JP 6-167640 A 6/1994
JP 2003-156698 A 5/2003

* cited by examiner

*Primary Examiner*—Dung T Nguyen
(74) *Attorney, Agent, or Firm*—Sughrue Mion, PLLC

(57) ABSTRACT

A laser light source device is disclosed, which reduces the coherence of the laser light and inexpensively achieves a visually recognizable level of speckle reduction without use of a mechanical driving means. The laser light source device includes: laser modules, each including a laser light source, an intensity modulation unit to apply intensity modulation to laser light emitted from the laser light source, and a first waveguide to receive the intensity-modulated laser light from the laser light source and output the laser light from an output end thereof; and a second waveguide including an input end optically connected to a light outputting area of the first waveguides to receive the laser light outputted from the first waveguides, the first waveguides being closely bundled in the vicinity of output ends thereof, wherein a core of the second waveguide at the input end is larger than the light outputting area.

5 Claims, 9 Drawing Sheets

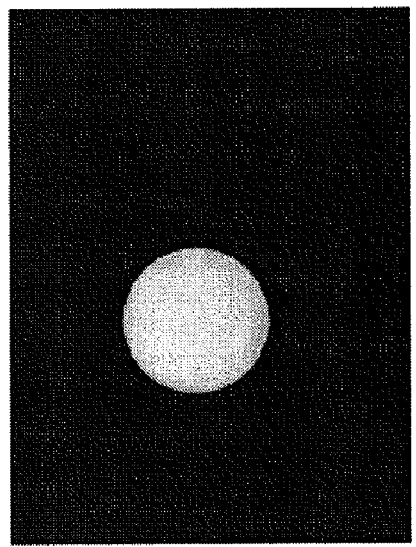
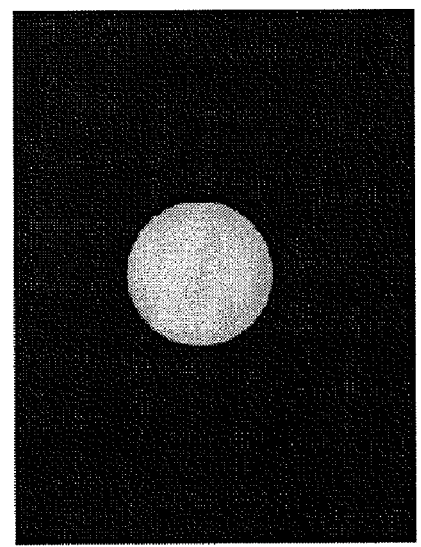
FIG.10
INTENSITY MODULATION

LASER LIGHT SOURCE DEVICE

BACKGROUND OF THE INVENTION

1. Field of the Invention

The present invention relates to a laser light source device, and in particular to a laser light source device having reduced speckle of laser light emitted therefrom.

2. Description of the Related Art

Laser light source devices have conventionally been used as an illumination device for use with an endoscope or interferometer. Such an illumination device is required to provide uniform illumination light. However, an illumination device employing the laser light source device may suffer from degradation of illumination performance caused by an uneven illumination pattern (hereinafter referred to as "speckle") due to coherence of the laser light. Further, in an imaging apparatus employing the laser light source device as the illumination device, the speckle of the laser light may significantly degrade quality of an acquired image.

Japanese Unexamined Patent Publication No. 2003-156698 proposes a laser light source device, in which the speckle of the laser light is reduced by applying vibration to an intermediate portion of a single-core multimode optical fiber. U.S. Pat. No. 7,113,657 proposes a laser light source device provided with a light phase controlling means, which controls the phase of laser light guided through a multimode optical fiber by forming a bend in the multimode optical fiber. Japanese Unexamined Patent Publication No. 6(1994)-167640 proposes a laser light source device, in which the speckle of the laser light is reduced by inputting the laser light to an optical fiber bundle formed by multimode optical fibers having fiber lengths that differ from each other by a length not less than the coherence length, and outputting the laser light from an output end of the optical fiber bundle.

However, since the speckle phenomenon is caused by the coherence of the laser light, if reduction of the coherence of the laser light is insufficient in the laser light source devices disclosed in the above Japanese Unexamined Patent Publication No. 2003-156698 and U.S. Pat. No. 7,113,657, the speckle reduction effect of the modulation applied to the mode coupling between multiple modes in the multimode optical fiber may not be visually recognizable. Namely, the present inventor has found that the speckle reduction effect of these laser light source devices is not visually recognizable if the laser light guided through the multimode optical fiber has a large amount of residual polarized component. The present invention has been achieved based on this finding.

Further, in the techniques disclosed in the above Japanese Unexamined Patent Publication No. 2003-156698 and U.S. Pat. No. 7,113,657, the modulation is applied to the multimode optical fiber by the mechanical driving means, and therefore, it is necessary to consider vibration and durability of the mechanical driving means in the laser light source device. In addition, in the technique disclosed in the above Japanese Unexamined Patent Publication No. 6(1994)-167640, it is difficult to produce the fiber bundle of fibers, which have fiber lengths that differ from each other by a length not less than the coherence length, and use of such a fiber bundle may lead to cost increase of the laser light source device.

SUMMARY OF THE INVENTION

In view of the above-described circumstances, the present invention is directed to providing a laser light source device which reduces coherence of laser light and inexpensively achieves a visually recognizable level of speckle reduction without use of a mechanical driving means.

In order to address the above-described problem, an aspect of the laser light source device of the invention includes: a plurality of laser modules, each laser module including a laser light source, an intensity modulation unit to apply intensity modulation to a laser light beam emitted from the laser light source, and a first optical waveguide to receive the intensity-modulated laser light from the laser light source and output the intensity-modulated laser light beam from an output end of the first optical waveguide; and a second optical waveguide having an input end optically connected to a light outputting area of the first optical waveguides of the laser modules to receive the laser light beams outputted from the first optical waveguides, the first optical waveguides being closely bundled in the vicinity of output ends of the first optical waveguides, wherein a core of the second optical waveguide at the input end is larger than the light outputting area.

The "closely bundled first optical waveguides" herein means that the first optical waveguides are arranged such that the output ends of the first optical waveguides are in the same plane and clearances along the plane between the first optical waveguides are minimized. The "light outputting area" herein refers to an area of the arranged first optical waveguides from which the laser light beams are outputted.

In the laser light source device of the invention, the intensity modulation unit may include a phase controlling unit.

In the laser light source device of the invention, the second optical waveguide may be connected to the bundled first optical waveguides in a position where an optical axis at the input end of the second optical waveguide is offset from a central axis of the light outputting area, and the light outputting area in the offset position may be positioned within an extent of a core at the input end of the second optical waveguide.

The "optical axis" herein refers to the axis at the center of the core extending along the longitudinal direction of the waveguide. The "central axis of the light outputting area" herein refers to an axis which is parallel to optical axes of the first optical waveguides and is positioned at the center (which may not strictly be the center and may include at a position in the vicinity of the center) of the optical axes. The "offset position" herein means that the central axis of the light outputting area and the optical axis of the second optical waveguide are substantially parallel to each other and has a fixed distance therebetween in a plane substantially perpendicular to the axes. The "positioned within an extent of a core" herein means that, when the light outputting area is projected on the core at the input end of the second optical waveguide, the projected light outputting area is contained within the extent of the core at the input end of the second optical waveguide.

Further, in the laser light source device of the invention, each of the first optical waveguides may be an optical fiber having a core diameter of 60 µm, and the second optical waveguide may be a multimode optical fiber having a core diameter selected from 205 µm and 230 µm. Further, the second optical waveguide may have a fiber length adapted to achieve a residual polarized component of the laser light beam outputted from the second optical waveguide of about 30% or less.

BRIEF DESCRIPTION OF THE DRAWINGS

FIG. 10 shows a result of experiment on speckle reduction of the invention.

DESCRIPTION OF THE PREFERRED EMBODIMENTS

Figure 1:
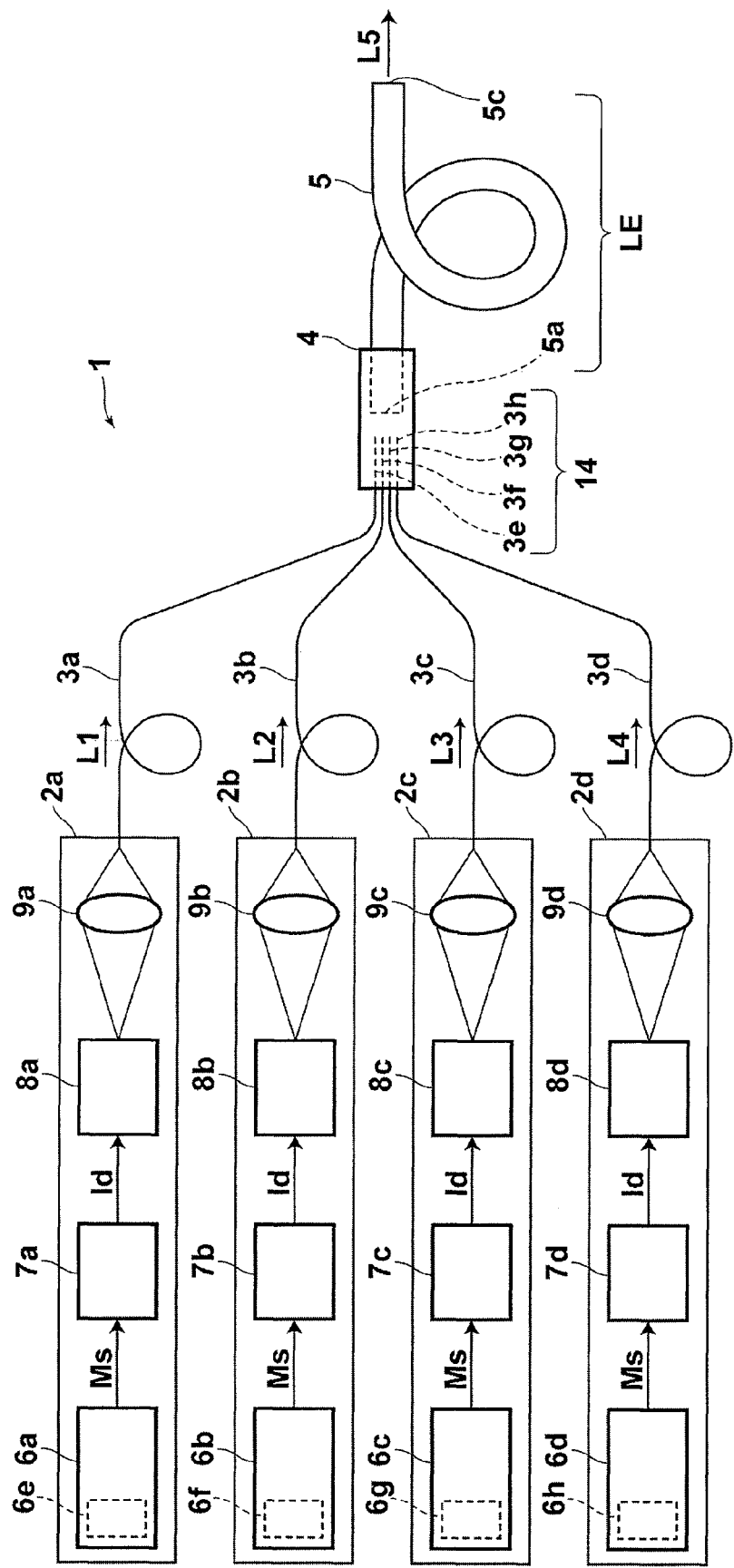
FIG. 1 is a diagram illustrating the schematic configuration of a laser light source device of the present invention.

Hereinafter, a laser light source device of the present invention will be described with reference to the drawings. FIG. 1 illustrates the schematic configuration of a laser light source device 1 of the invention. As shown in FIG. 1, the laser light source device 1 includes four laser modules 2a to 2d. Optical fibers 3a to 3d of the laser modules 2a to 2d are bundled at a position in the vicinity of output ends 3e to 3h of the optical fibers 3a to 3d, and are optically connected to an input end 5a of a multimode optical fiber 5 via an optical connector 4. Although the laser light source device 1 described in this embodiment includes the four laser modules, as one example, this is not intended to limit the invention, and the laser light source device 1 may include two or more laser modules.

Next, the laser modules 2a to 2d are described. The laser modules 2a to 2d respectively include: signal generators 6a to 6d to generate modulation signals Ms; laser drivers 7a to 7d to receive the modulation signals Ms inputted thereto; laser light sources 8a to 8d driven by driving currents Id inputted from the laser drivers 7a to 7d; and light collection optical systems 9a to 9d to collect and direct laser light L emitted from laser light sources 8a to 8d onto the optical fibers 3a to 3d.

The signal generators 6a to 6d can generate the modulation signals Ms having a desired voltage output. Specifically, for observation of speckle reduction using a CCD, the modulation signals Ms may have a frequency of about 10 Hz, which is not less than the frame rate, however, a sine wave or a rectangular wave having a frequency of 10 MHz or more could also be generated. In this embodiment, the modulation signals Ms are described as a sine wave of 1 Vp-p and 1 KHz, as one example, however, this is not intended to limit the invention. The signal generators 6a to 6d may respectively include phase controlling units 6e to 6h to control the modulation signals Ms to have equally spaced phase differences therebetween. As one example in this embodiment, the phase controlling units 6e to 6h exert control such that phases of the adjacent modulation signals Ms generated by the four signal generators 6a to 6d differ from each other by 90 degrees, however, this is not intended to limit the invention.

The laser drivers 7a to 7d apply voltage/current conversion and gain control to the modulation signals Ms outputted from the signal generators 6a to 6d. As described later, a threshold current Ith is provided for the laser light sources 8a to 8d, so that the laser light sources 8a to 8d do not emit laser light beams L1 to L4 when a current smaller than the threshold current Ith is fed thereto. Therefore, the laser drivers 7a to 7d feed a bias current Ib to the laser light sources 8a to 8d, and also superimpose a current according to each modulation signal Ms fed from the signal generators 6a to 6d on the bias current Ib to feed the superimposed current as a driving current Id to the laser light sources 8a to 8d.

Figure 2:
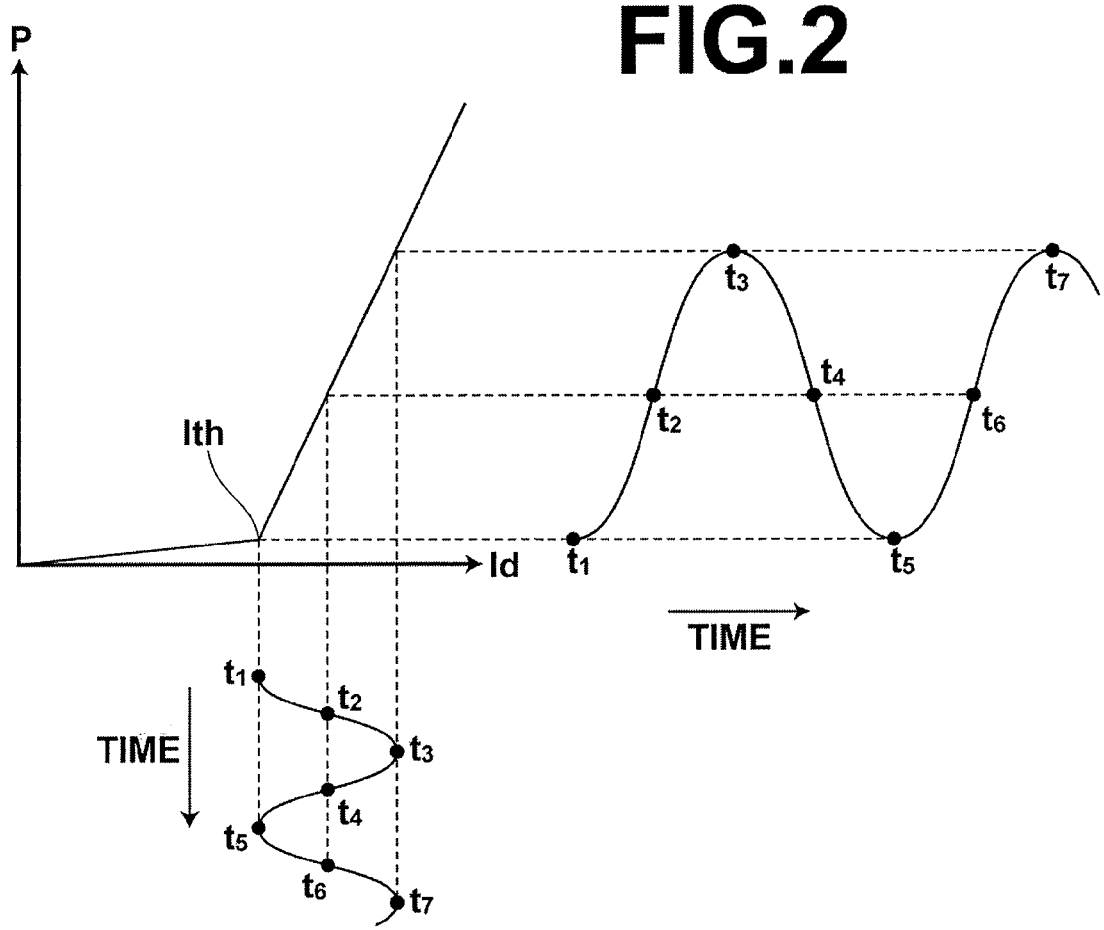
FIG. 2 is a graph showing the correlation between a driving current and a light intensity of the laser light.

The laser light sources 8a to 8d each include a laser package (not shown). When the driving current Id exceeds the threshold current Ith, the laser light sources 8a to 8d emit laser light beams L1 to L4 each having a light intensity P according to the magnitude of the driving current Id. FIG. 2 shows the correlation between the driving current and the light intensity of the laser light emitted from the laser module. As shown in FIG. 2, as the driving current Id is varied as indicated by t1-t7, the light intensity P of the laser light L is modulated as indicated by t1-t7. A ratio between the maximum value and the minimum value of the light intensity P of the intensity-modulated laser light L is a degree of modulation. As one example in this embodiment, the laser light sources 8a to 8d emit laser light beams L1 to L4 having a wavelength of 405 nm and a power of 100 mW, however, this is not intended to limit the invention.

The intensity-modulated laser light beams L1 to L4 emitted from the laser light sources 8a to 8d are respectively collected by the light collection optical systems 9a to 9d and inputted to the optical fibers 3a to 3d to be guided therethrough. As one example, the optical fibers 3a to 3d may be four multimode optical fibers having a core diameter of 60 µm, an outer diameter of 80 µm, and a fiber length of 1 m, however, this is not intended to limit the invention. In the case where the optical fibers 3a to 3d are connected to the multimode optical fiber 5, as will be described later, the optical fibers 3a to 3d maybe any optical fibers that can respectively guide the laser light beams L1 to L4 emitted from the light source units 7a to 7d, such as single-mode optical fibers having a core diameter of around 10 µm.

Next, the multimode optical fiber 5 used in the laser light source device 1 of the invention is described. Using a measurement system 10 shown in FIG. 3, the present inventor measured the correlation between the fiber length LE and a residual polarized component RP of the laser light beam L1 outputted from the multimode optical fiber 5 for each of three multimode optical fibers having different core diameters: 60 µm, 205 µm and 230 µm.

The measurement system 10 is formed by: the above-described laser module 2a including the multimode optical fiber 5, which is provided in place of the optical fiber 3a; an output-side lens 11 to collimate the laser light beam L1 outputted from the multimode optical fiber into parallel light; a polarizer 12; and a power meter 13. The components of the measurement system 10 in FIG. 3 that are the same as those of the laser light source device 1 are designated by the same reference numerals, and explanations thereof are omitted. It should be noted that, in FIG. 3, the signal generator 6a and the laser driver 7a of the laser module 2a are omitted.

Figure 3:
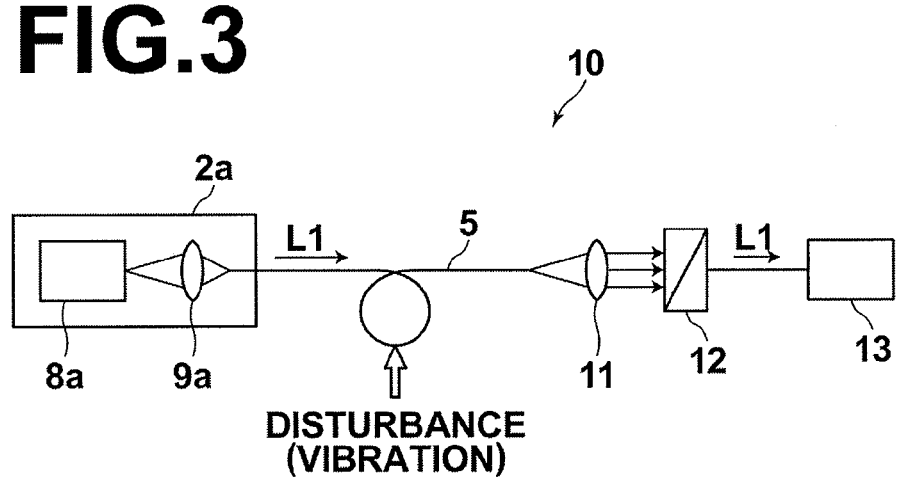
FIG. 3 is a diagram illustrating the schematic configuration of a measurement system for measuring a residual polarized component of the laser light.

To measure the residual polarized component RP, the laser light beam L1 emitted from the laser module 3a is inputted to the multimode optical fiber 5, and the laser light beam L1 guided through the multimode optical fiber 5 is inputted to the polarizer 12 via the output-side lens 11. Then, the power of the laser light beam L1 transmitted through the polarizer 12 is measured. As shown in FIG. 3, a disturbance is applied to the multimode optical fiber 5 and fluctuation of the power of the laser light beam L1 is measured. Namely, the residual polarized component RP is defined as follows: residual polarized component RP (%)=minimum power/maximum power. Alternatively, accurate measurement of the coherence of the laser light beam L1 can be achieved by measuring a degree of polarization (DOP) by removing the polarizer 12 and using a polarization analyzer in place of the power meter 13.

The degree of polarization DOP is defined as follows: degree of polarization DOP=$(S_1^2+S_2^2+S_3^2)^{0.5}/S_0$, wherein $S_0$ represents a total optical power, $S_1$ represents a linear polarized component, $S_2$ represents an inclination component, and $S_3$ represents a circular polarized component.

Figure 4:
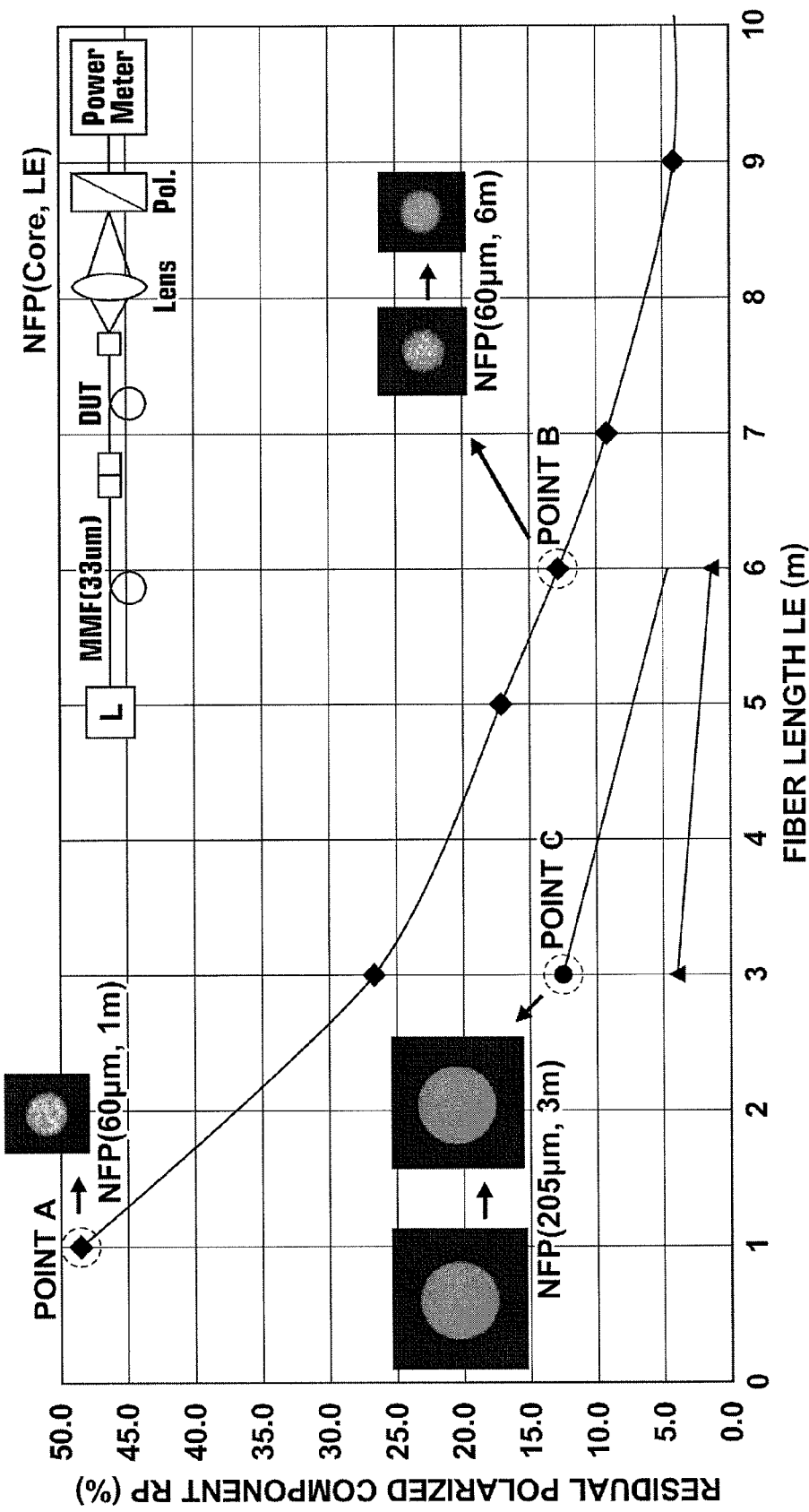
FIG. 4 is a graph showing the correlation between the residual polarized component of the laser light and a fiber length of a multimode optical fiber.

FIG. 4 shows the correlation between the fiber length LE and the residual polarized component RP of the laser light beam L1 outputted from the multimode optical fiber 5, i.e., each of the three multimode optical fibers having different core diameters. As shown in FIG. 4, for the core diameter of 60 μm and the fiber length LE of 1 m (point A in the drawing), the residual polarized component RP of the laser light beam L1 outputted from the multimode optical fiber 5 is about 48%. For the core diameter of 60 μm and the fiber length LE of 6 m (point B in the drawing) and for the core diameter of 205 μm and the fiber length LE of 3 m (point C in the drawing), the residual polarized component RP of the laser light beam L1 outputted from the multimode optical fiber 5 is about 13%.

Next, near-field patterns NFP, which are obtained by applying vibration to a looped portion of the multimode optical fiber 5 having the core diameter and the fiber length LE at each of the above points A-C in the drawing, are described. The near-field pattern NFP is observed by connecting a NFP measurement system to an output end 5c of the multimode optical fiber 5 of the laser light source device 1.

FIG. 4 also shows the near-field patterns NFP that are obtained when each of the multimode optical fibers respectively having the core diameters and the fiber lengths LE at the points A-C in the drawing are used as the multimode optical fiber 5. As shown in FIG. 4, when the residual polarized component RP is around 48% (point A in the drawing), it is difficult to achieve a visually recognizable level of speckle reduction in the near-field pattern NFP by applying the vibration. On the other hand, when the residual polarized component RP is around 13% (points B and C in the drawing), a visually recognizable level of speckle reduction in the near-field pattern NFP is achieved by applying the vibration. It should be noted that, in the pairs of near-field patterns NFP shown for points B and C in the drawing, the left near-field pattern NFP of each pair is one obtained before the application of vibration and the right near-field patterns NFP of each pair is one obtained during the application of vibration.

The present inventor has found, after repeated observation of the near-field patterns NFP of the multimode optical fibers 5 having the three different core diameters of 60 μm, 205 μm and 230 μm through the above-described method, that the visually recognizable level of speckle reduction by applying the disturbance is achieved when the core diameter and the fiber length LE of the multimode optical fiber 5 are in the range where the residual polarized component RP of the laser light beam L1 outputted from the multimode optical fiber 5 is about 30% or less. As described above, when the residual polarized component RP is about 15% or less, the visually recognizable level of speckle reduction in the near-field pattern NFP is sufficiently achieved. When the residual polarized component RP is even smaller, the visually recognizable level of speckle reduction is also achieved in observation of the near-field pattern NFP using an imaging device, such as a CCD, having higher sensitivity and density.

The present inventor has further found that the visually recognizable level of speckle reduction is more easily achieved with a larger fiber length LE and a larger core diameter of the multimode optical fiber 5 and a smaller loop diameter of the looped portion. The present inventor has further found that, for the laser light beam L1 with a smaller amount of the residual polarized component RP outputted from the multimode optical fiber, the visually recognizable level of speckle reduction can be achieved with a smaller amplitude of the applied vibration. This indicates that, in the case where the modulation is applied to the transverse mode of the near-field pattern NFP, a larger speckle reduction effect is obtained when the transverse mode is more easily subjected to the mode modulation and the mode coupling, i.e., when the residual polarized component RP is smaller, the fiber length LE and the core diameter of the multimode optical fiber 5 are larger, and the loop diameter of the looped portion is smaller.

Therefore, the multimode optical fiber 5 of the invention may have a core diameter and a fiber length LE that achieve the residual polarized component RP of the laser light beam L1 outputted from the multimode optical fiber 5 of about 30% or less, or optionally about 15% or less. As one example, the multimode optical fiber 5 may be a multimode optical fiber having a core diameter of 205 μm, an outer diameter of 250 μm, and a fiber length of 3 m, however, this is not intended to limit the invention.

Figure 5:
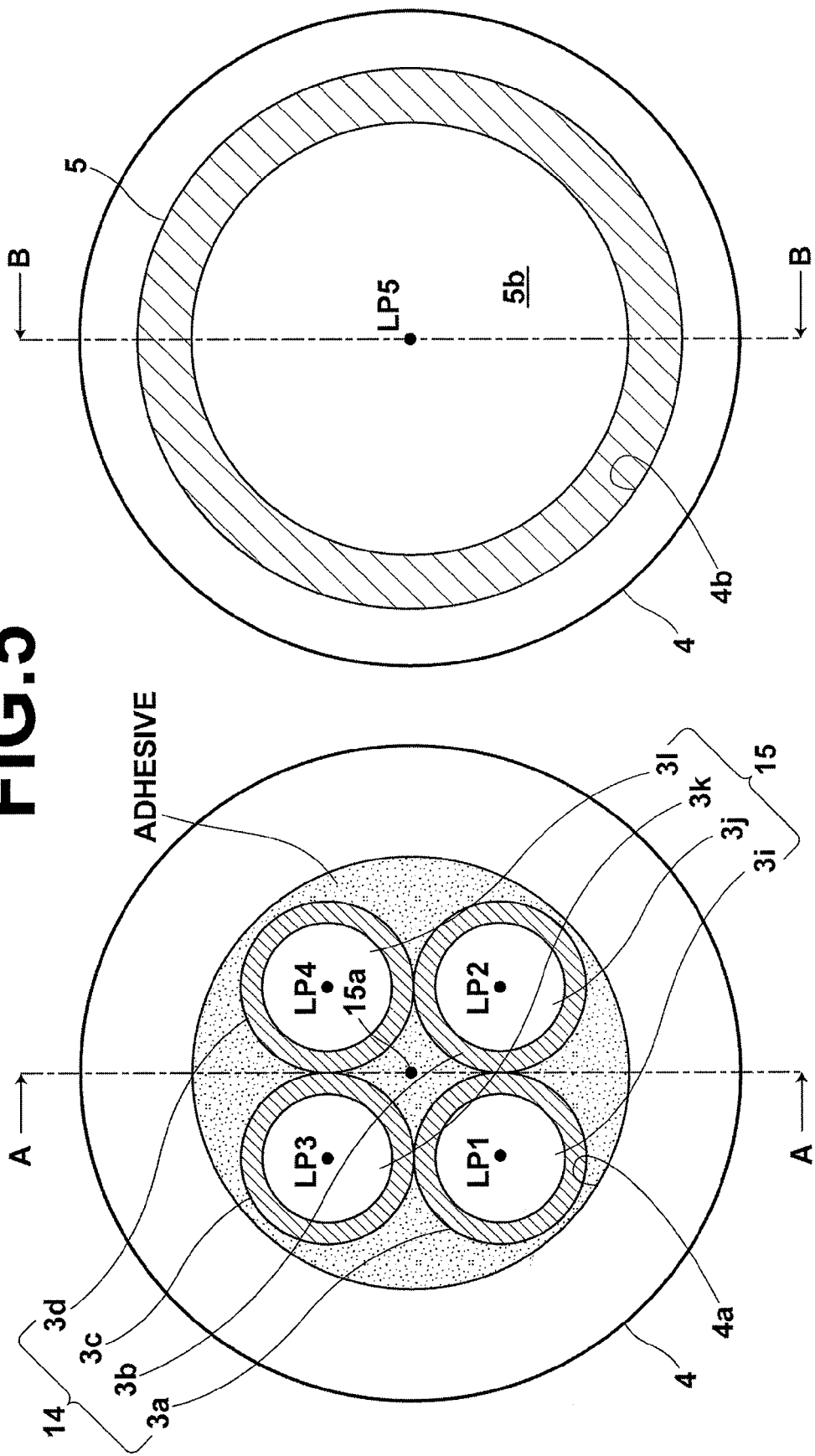
FIG. 5 is a sectional view at a connection surface between optical fibers and the multimode optical fiber.
Figure 6:
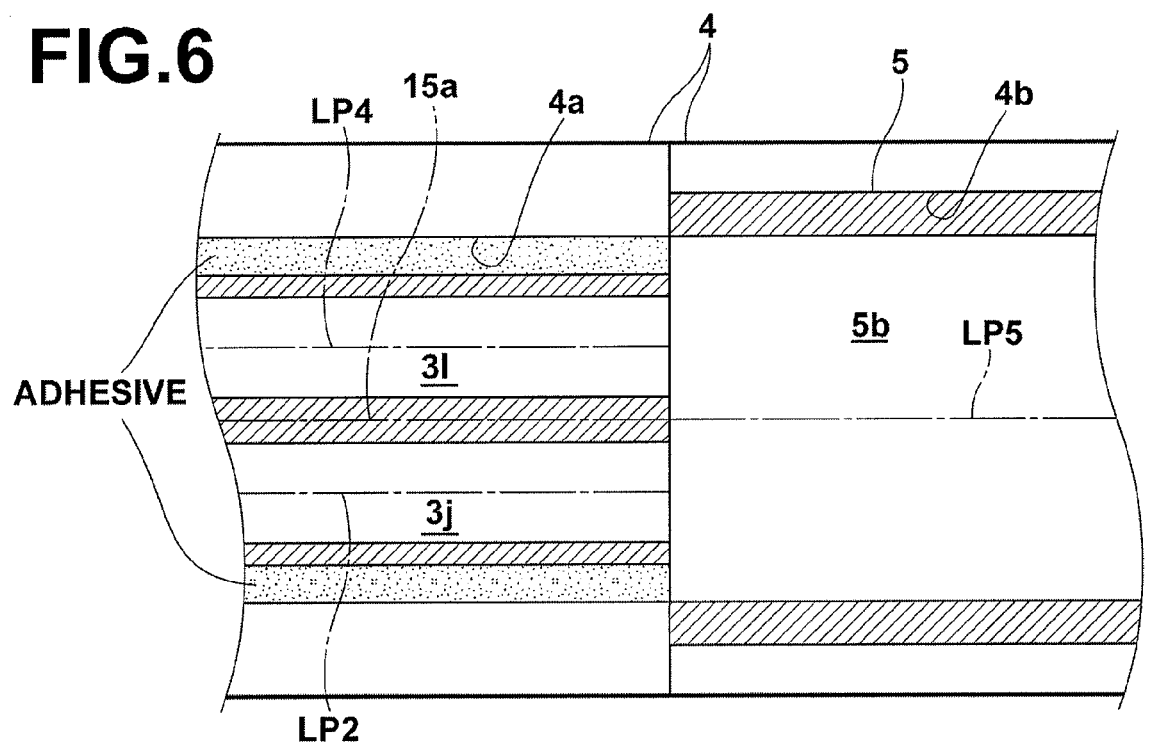
FIG. 6 is a side sectional view of an area around the connection surface between the optical fibers and the multimode optical fiber.

Next, connection between the optical fibers 3a to 3d and the multimode optical fiber 5 is described. As described above, the optical fibers 3a to 3d are optically connected to the multimode optical fiber 5 in a removable manner via the optical connector 4. FIG. 5 is a sectional view at a connection surface between the optical fibers 3a to 3d and the multimode optical fiber 5. FIG. 6 is a side sectional view of an area around the connection surface between the optical fibers 3a to 3d and the multimode optical fiber 5. FIG. 6 shows a connection state in cross-section with the optical fibers 3a to 3d taken along the direction of arrow A in FIG. 5 and the multimode optical fiber 5 taken along the direction of arrow B in FIG. 5. In FIGS. 5 and 6, the optical fibers 3a to 3d are four multimode optical fibers having a core diameter of 60 μm and an outer diameter of 80 μm, and the multimode optical fiber 5 has a core diameter of 205 μm and an outer diameter of 250 μm.

As shown on the left in FIG. 5, the optical fibers 3a to 3d are arranged such that optical axes LP1 to LP4 of the optical fibers 3a to 3d are parallel to each other, output ends of the optical fibers 3a to 3d are in the same plane, and clearances are minimized. The optical fibers 3a to 3d are inserted into a fiber fixing hole 4a of the optical connector 4 and fixed with an adhesive, or the like, to form a fiber bundle section 14. The adhesive preferably has a service temperature limit that is suitable for the laser light sources 8a to 8d to be used. The fiber bundle section 14 includes a light outputting area 15 from which the light beams from cores 3i to 3l of the optical fibers 3a to 3d are outputted, and a central axis 15a in parallel with the optical axes LP1 to LP4 formed at the center of the light outputting area 15. The light outputting area 15 is polished. The shape of the end face of the light outputting area 15 is not particularly limited as long as a connection loss is minimized, and may be semispherical or planer, for example. In this embodiment, the fiber bundle section 14 is formed by arranging the four optical fibers 3a to 3d such that the optical axes LP1 to LP4 form four corner points of a square, and fixing the optical fibers 3a to 3d in the fiber fixing hole 4a having a diameter of 200 μm, as one example, with a thermoset epoxy resin.

Similarly to the fiber bundle section 14, an input end 5a of the multimode optical fiber 5 is inserted into a fiber fixing hole 4b of the optical connector 4 and is fixed using an adhesive, or the like, as shown on the right in FIG. 5. As one example in this embodiment, the multimode optical fiber 5 is fixed in the fiber fixing hole 4b having a diameter of 250 μm with a thermoset epoxy resin.

The fiber bundle section 14 is connected to the multimode optical fiber 5 such that the light outputting area 15 of the fiber bundle section 14 is positioned within the extent of a core 5b of the multimode optical fiber 5. That is, the fiber bundle section 14 is connected to the multimode optical fiber 5 such that, when the light outputting area 15 is projected on the input end 5a of the multimode optical fiber 5, the light outputting area 15 is contained within the extent of the core 5b, in order to prevent loss. Further, in this embodiment, the central axis 15a of the light outputting area 15 of the fiber bundle section 14 is coaxial with an optical axis LP5 of the multimode optical fiber 5, as shown in FIG. 6.

Figure 7:
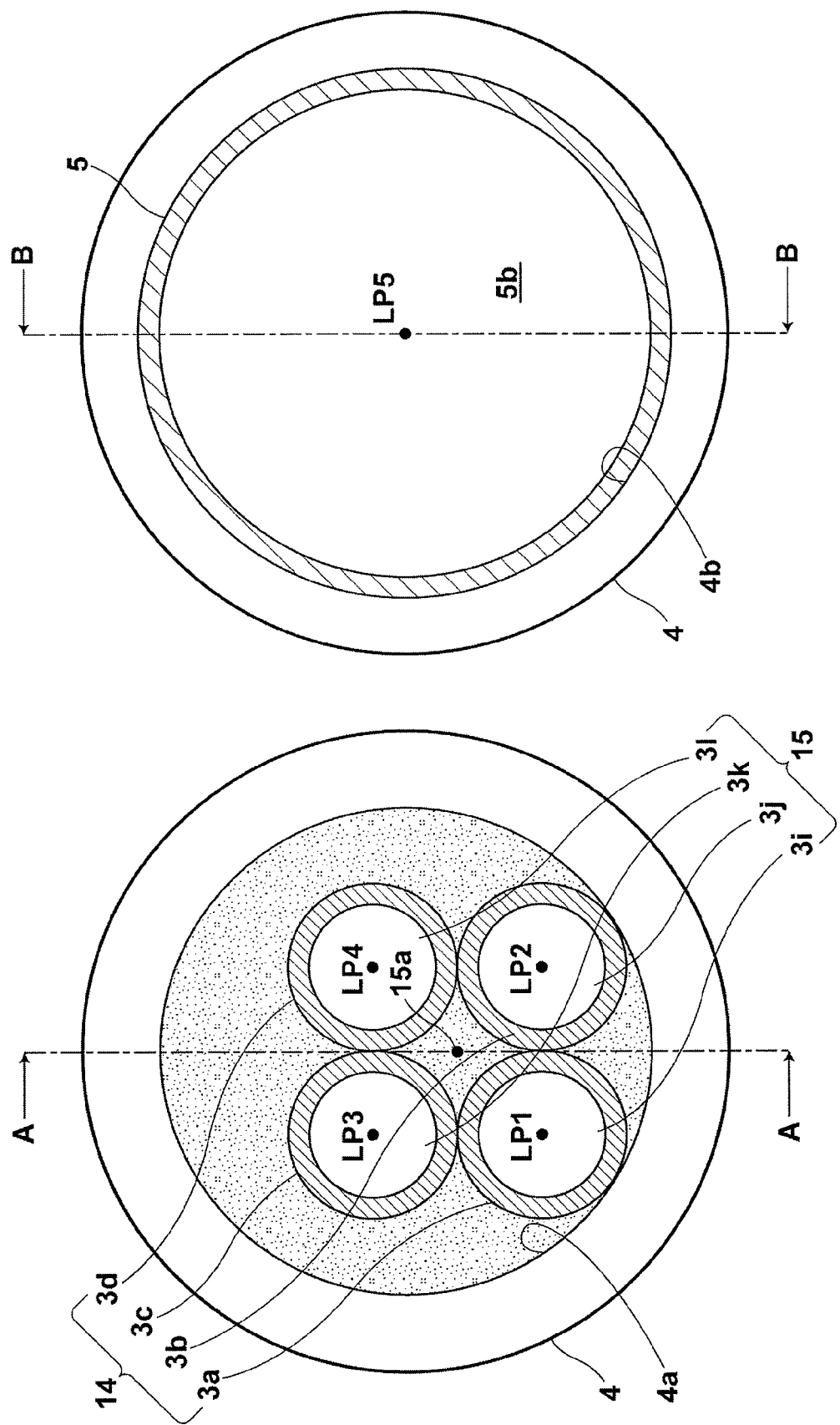
FIG. 7 is a sectional view at a connection surface between the optical fibers and the multimode optical fiber according to another embodiment.
Figure 8:
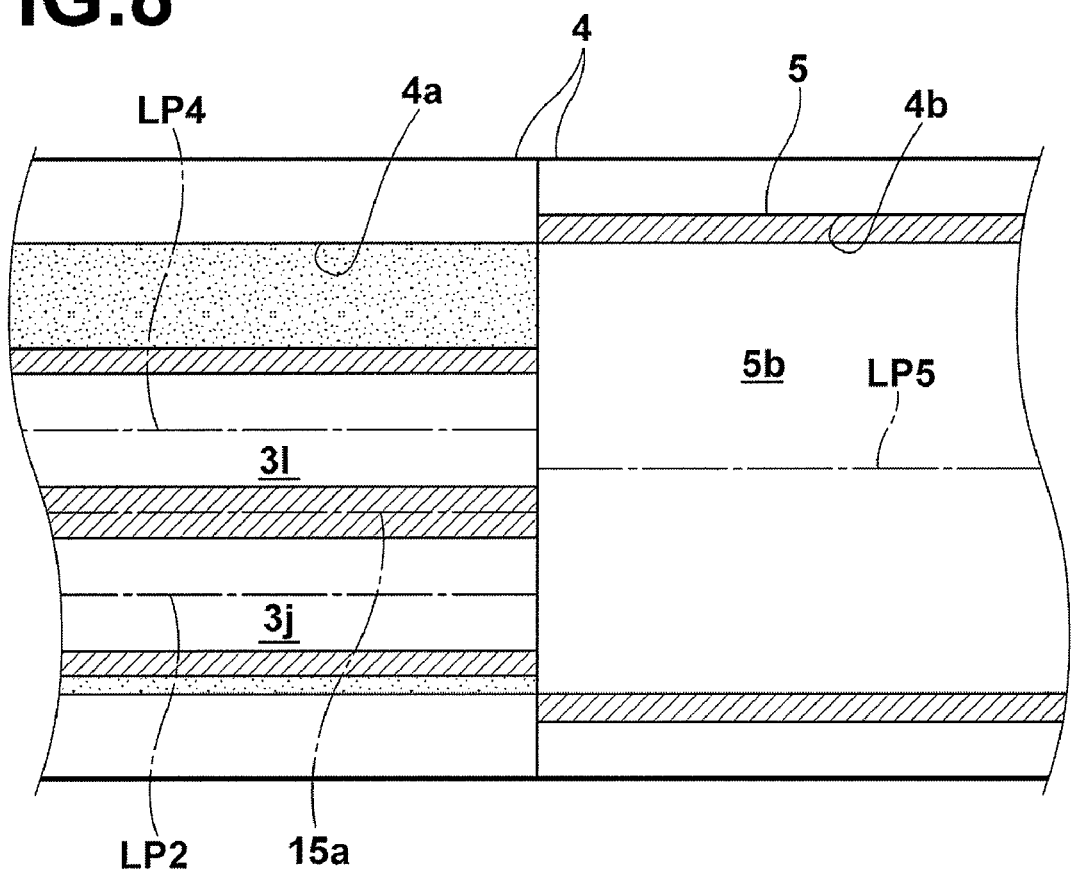
FIG. 8 is a side sectional view of an area around the connection surface between the optical fibers and the multimode optical fiber according to another embodiment.

Next, another embodiment of the connection between the optical fibers 3a to 3d and the multimode optical fiber 5 is described. FIG. 7 is a sectional view at a connection surface between the optical fibers 3a to 3d and the multimode optical fiber 5 in this embodiment. FIG. 8 is a side sectional view of an area around the connection surface between the optical fibers 3a to 3d and the multimode optical fiber 5 in this embodiment. In FIGS. 7 and 8, the optical fibers 3a to 3d are multimode optical fibers having a core diameter of 60 μm and an outer diameter of 80 μm, and the multimode optical fiber 5 has a core diameter of 230 μm and an outer diameter of 250 μm. It should be noted that the elements shown in FIGS. 7 and 8 that are the same as those shown in FIGS. 5 and 6 are designated by the same reference numerals and explanations thereof are omitted.

In this embodiment, as shown in FIGS. 7 and 8, the optical fibers 3a to 3d is connected to the multimode optical fiber 5 such that the central axis 15a of the light outputting area 15 is offset from the optical axis LP5 of the multimode optical fiber 5. That is, the optical fibers 3a to 3d are connected to the multimode optical fiber 5 in a state where the central axis 15a and the optical axis LP5 are parallel to each other and have a fixed distance therebetween. In this structure, the intensity-modulated laser light beams L1 to L4 outputted from the light outputting area 15 are guided through the multimode optical fiber 5 with optical path differences, and this reduces the residual polarized component RP in the laser light L5 outputted from the multimode optical fiber 5. Specifically, as one example, the fiber bundle section 14 may be formed with the fiber fixing hole 4a of the optical connector, which receives the optical fibers 3a to 3d, having a diameter of 220 μm. As shown in FIG. 6, the light outputting area 15 is also positioned within the extent of the core 5b of the multimode optical fiber 5 when the optical fibers 3a to 3d are connected to the multimode optical fiber 5 in the offset position.

Although the optical fibers 3a to 3d are connected to the multimode optical fiber 5 via the optical connector 4 in this embodiment, this is not intended to limit the invention. The optical fibers 3a to 3d may be fixed to the multimode optical fiber 5 through fusion splicing.

Next, operation of the laser light source device 1 is described.

As the modulation signals Ms fed from the signal generators 6a to 6d are inputted to the laser drivers 7a to 7d, the laser drivers 7a to 7d superimpose the bias current Ib on the modulation signals Ms and output the thus modulated driving currents Id to the laser light sources 8a to 8d.

When the driving current Id exceeds the threshold current Ith, the laser light sources 8a to 8d emit the laser light beams L1 to L4 each having the light intensity P which is modulated based on the amount of the driving current Id. The intensity-modulated laser light beams L1 to L4 are guided through the optical fibers 3a to 3d and are inputted from the fiber bundle section 14 to the multimode optical fiber 5 via the optical connector 4.

The intensity-modulated laser light beams L1 to L4 inputted to the multimode optical fiber 5 are guided through the multimode optical fiber 5. This reduces the residual polarized component RP and provides dense speckle patterns of the laser light beams L1 to L4. Then, the laser light L5, which has a super imposed speckle pattern of the speckle patterns of the intensity-modulated laser light beams L1 to L4, is outputted from the output end 5c.

Figure 9:
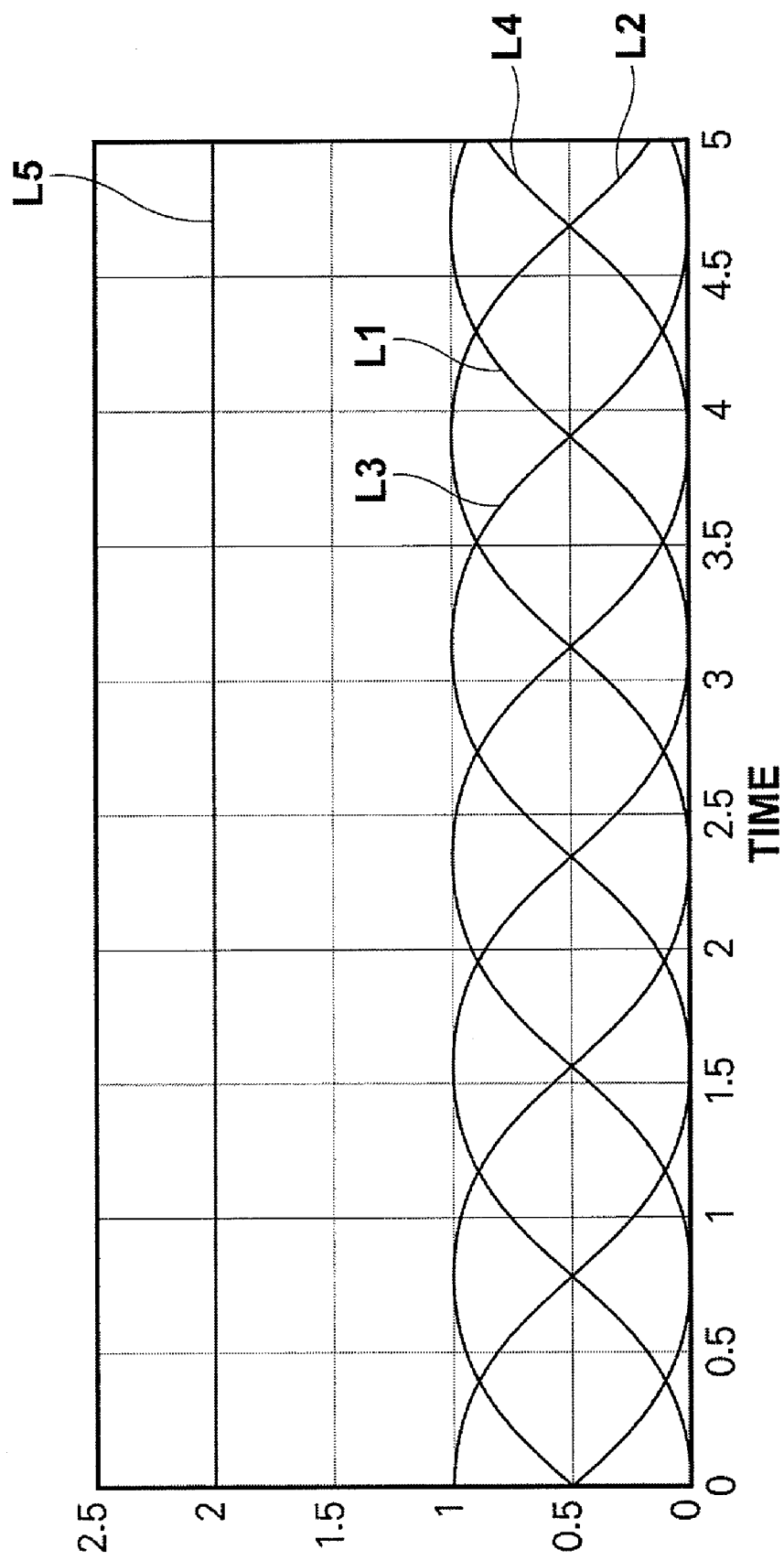
FIG. 9 is a graph showing laser light beams and light intensities of the laser light beams outputted from the multimode optical fiber 5.

In the laser light source device 1, the phase controlling units 6e to 6h exert control so that the modulation signals Ms have equally spaced phase differences. Thus, as shown in FIG. 9, the laser light beams L1 to L4 emitted from the laser modules 2a to 2d have light intensities with equally spaced phase differences, thereby achieving a constant light intensity of the outputted laser light L5, which is the sum of the intensities of the laser light beams L1 to L4.

FIG. 10 shows a result of experiment on the speckle reduction of the laser light source device 1. The image shown on the left in FIG. 10 is a near-field pattern NFP at the output end 5c of the multimode optical fiber 5 of the laser light L5 before intensity modulation, and the image shown on the right in FIG. 10 is a near-field pattern NFP at the output end 5c of the multimode optical fiber 5 of the intensity-modulated laser light L5.

In this experiment, the fiber bundle section 14 is formed by the four optical fibers 3a to 3d having a core diameter of 60 μm, an outer diameter of 80 μm and a fiber length of 1 m, and the fiber bundle section 14 is connected via the connector 4 to the multimode optical fiber 5 having a core diameter of 205 μm and an outer diameter of 250 μm. The modulation signals Ms fed from the signal generators 6a to 6d are sine waves of 1 Vp-p and 1 KHz, as described above, and the degree of modulation thereof is 50%. As shown on the right in FIG. 10, as the laser light beams L1 to L4 are guided through the multimode optical fiber 5, the residual polarized component RP of the laser light beams L1 to L4 is reduced and a more dense speckle pattern is provided at the output end 5c of the multimode optical fiber 5, and thus the influence of the intensity modulation is increased. In other words, it has been confirmed through this experiment that, as the residual polarized component RP is reduced, the speckle patterns of the laser light beams L1 to L4 guided through the multimode optical fiber 5 has a smaller pitch, and the coherence distance of the laser light beams L1 to L4 is reduced. Thus the influence of the intensity modulation is increased, thereby achieving a visually recognizable level of speckle reduction.

In the laser light source device 1 of the invention, the laser light beams L1 to L4 emitted from the laser modules 2a to 2d are inputted to the multimode optical fiber 5. The mode coupling between multiple modes and the mode modulation at the multimode optical fiber 5 reduce the residual polarized component RP of the laser light beams L1 to L4 guided through the multimode optical fiber 5. This produces denser speckle patterns of the laser light beams L1 to L4 and makes the coherence distance of the laser light beams L1 to L4 shorter, thereby achieving sufficiently reduced coherence of the laser light beams L1 to L4. The dense speckle patterns are superimposed at the output end 5c of the multimode optical fiber 5, and a more even speckle pattern is provided. In this state, intensities of the laser light beams L1 to L4 are modulated, and thus the visually recognizable level of speckle reduction in the near-field pattern NFP of the laser light L5 is achieved.

Further, in the laser light source device 1 of the invention, the modulation signals Ms fed from the signal generators 6a to 6d are respectively superimposed on the bias current Ib at the laser drivers 7a to 7d, and the thus modulated driving currents Id are fed to the laser light sources 8a to 8d to emit the modulated laser light beams L1 to L4. Therefore, the modulation is achieved without using a mechanical driving means, and there is no concern of vibration and durability of such a mechanical driving means in the laser light source device 1.

Further, since the laser light source device 1 of the invention does not employ a fiber bundle formed by optical fibers having fiber lengths LE that differ from each other by a length not less than the coherence length, the laser light source device 1 of the invention can easily be manufactured and there is no concern of cost increase.

Moreover, the laser light source device 1 of the invention includes the phase controlling units 6e to 6h. By superimposing the laser light beams L1 to L4 having the light intensities P with equally spaced phase differences, a constant light intensity P of the laser light L5 outputted from the output end 5c of the multimode optical fiber 5 can be achieved.

Thus, the laser light source device 1 of the invention can reduce the coherence of the laser light beams L1 to L4 and can inexpensively achieve the visually recognizable level of speckle reduction without using a mechanical driving means.

According to the laser light source device of the invention, the plurality of intensity modulation units apply intensity modulation to the laser light beams emitted from the plurality of laser light sources. Thus, the modulation can be applied without using a mechanical means. Further, the plurality of first optical waveguides receive the intensity-modulated laser light beams and output the laser light beams from the light outputting area of the first optical waveguides, which are closely bundled in the vicinity of the output ends thereof. The laser light beams are then guided through the second optical waveguide optically connected to the light outputting area and having a core larger than the light outputting area. This reduces the residual polarized component of the laser light beams. The speckle patterns of the laser light beams with reduced coherence are superimposed at the output end of the second optical waveguide to achieve visually recognizable level of speckle reduction of the laser light outputted from the output end of the second optical waveguide.

In a case where the intensity modulation unit includes a phase controlling unit, the phase of each intensity-modulated laser light beam can be controlled, thereby achieving a constant light intensity of the laser light outputted from the output end with the visually recognizable level of speckle reduction.

What is claimed is:

1. A laser light source device comprising:
   a plurality of laser modules, each laser module comprising a laser light source, an intensity modulation unit to apply intensity modulation to a laser light beam emitted from the laser light source, and a first optical waveguide to receive the intensity-modulated laser light from the laser light source and output the intensity-modulated laser light beam from an output end of the first optical waveguide; and
   a second optical waveguide comprising an input end, the input end being optically connected to a light outputting area of the first optical waveguides of the laser modules to receive the laser light beams outputted from the first optical waveguides, the first optical waveguides being closely bundled in the vicinity of output ends of the first optical waveguides,
   wherein a core of the second optical waveguide at the input end is larger than the light outputting area and the second optical waveguide reduces a residual polarized component of each of the laser light beams that propagate through the second optical waveguide.

2. The laser light source device as claimed in claim 1, wherein the intensity modulation unit further comprises a phase controlling unit.

3. The laser light source device as claimed in claim 1, wherein
   the second optical waveguide is connected to the bundled first optical waveguides in a position where an optical axis at the input end of the second optical waveguide is offset from a central axis of the light outputting area, and
   the light outputting area in the offset position is positioned within an extent of a core at the input end of the second optical waveguide.

4. A laser light source device comprising:
   a plurality of laser modules, each laser module comprising a laser light source, an intensity modulation unit to apply intensity modulation to a laser light beam emitted from the laser light source, and a first optical waveguide to receive the intensity-modulated laser light from the laser light source and output the intensity-modulated laser light beam from an output end of the first optical waveguide; and
   a second optical waveguide comprising an input end, the input end being optically connected to a light outputting area of the first optical waveguides of the laser modules to receive the laser light beams outputted from the first optical waveguides, the first optical waveguides being closely bundled in the vicinity of output ends of the first optical waveguides,
   wherein a core of the second optical waveguide at the input end is larger than the light outputting area, wherein
   each first optical waveguide comprises an optical fiber having a core diameter of 60 μm, and
   the second optical waveguide comprises a multimode optical fiber having a core diameter selected from 205 μm and 230 μm.

5. The laser light source device as claimed in claim 4, wherein the second optical waveguide has a fiber length adapted to achieve a residual polarized component of the laser light beam outputted from the second optical waveguide of about 30% or less.

* * * * *